(12) United States Patent
Kang et al.

(10) Patent No.: US 10,998,390 B2
(45) Date of Patent: May 4, 2021

(54) ORGANIC LIGHT EMITTING DIODE DISPLAY AND A MANUFACTURING METHOD THEREOF

(71) Applicant: SAMSUNG DISPLAY CO., LTD., Yongin-si (KR)

(72) Inventors: Hoon Kang, Yongin-si (KR); Jun Gi Kim, Hwaseong-si (KR); Bo Geon Jeon, Hwaseong-si (KR); Eui Suk Jung, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/663,208

(22) Filed: Oct. 24, 2019

(65) Prior Publication Data

US 2020/0203452 A1  Jun. 25, 2020

(30) Foreign Application Priority Data

Dec. 24, 2018 (KR) .................. 10-2018-0168648

(51) Int. Cl.
*H01L 27/32* (2006.01)
*H01L 51/00* (2006.01)
(Continued)

(52) U.S. Cl.
CPC .......... *H01L 27/3248* (2013.01); *H01L 23/52* (2013.01); *H01L 23/535* (2013.01);
(Continued)

(58) Field of Classification Search
CPC ............. H01L 27/3248; H01L 27/3258; H01L 27/3262; H01L 51/0021; H01L 51/5246;
(Continued)

(56) References Cited

U.S. PATENT DOCUMENTS

| 2002/0163614 A1* | 11/2002 | Hinata | G02F 1/1345 |
| | | | 349/139 |
| 2014/0361261 A1* | 12/2014 | Choi | H01L 51/5218 |
| | | | 257/40 |
| 2015/0144908 A1* | 5/2015 | Yoon | H01L 27/3246 |
| | | | 257/40 |

FOREIGN PATENT DOCUMENTS

| JP | 2001117509 | 4/2001 |
| JP | 2011199267 | 10/2011 |

(Continued)

*Primary Examiner* — Feifei Yeung Lopez
(74) *Attorney, Agent, or Firm* — F. Chau & Associates, LLC

(57) ABSTRACT

An organic light emitting diode display is provided including a first display panel. The first display panel includes a first substrate and a transistor disposed on the first substrate. The transistor includes an input electrode and an output electrode. A second display panel is provided including a second substrate, a first electrode disposed on the second substrate, an emission layer disposed on the first electrode, and a second electrode disposed on the emission layer. A first connector is disposed on the output electrode and between the first display panel and the second display panel. The second display panel further includes a first opening formed in the second substrate and a pixel electrode connector disposed in the first opening. The output electrode of the transistor is electrically connected to the first electrode through the first connector, and the first electrode and the first connector are electrically connected through the pixel electrode connector.

12 Claims, 12 Drawing Sheets

(51) Int. Cl.

| | |
|---|---|
| *H01L 51/52* | (2006.01) |
| *H01L 51/56* | (2006.01) |
| *H01L 23/535* | (2006.01) |
| *H01L 23/538* | (2006.01) |
| *H01L 23/52* | (2006.01) |

(52) U.S. Cl.
CPC ........ *H01L 23/538* (2013.01); *H01L 23/5386* (2013.01); *H01L 27/3258* (2013.01); *H01L 27/3262* (2013.01); *H01L 51/0021* (2013.01); *H01L 51/0022* (2013.01); *H01L 51/0027* (2013.01); *H01L 51/5246* (2013.01); *H01L 51/56* (2013.01)

(58) Field of Classification Search
CPC ... H01L 51/0022; H01L 23/52; H01L 23/535; H01L 23/538; H01L 23/5386
See application file for complete search history.

(56) References Cited

FOREIGN PATENT DOCUMENTS

| KR | 10-0630475 | 9/2006 |
|---|---|---|
| KR | 10-2011-0078557 | 7/2011 |
| KR | 10-1505906 | 3/2015 |
| KR | 10-2015-0141418 | 12/2015 |
| KR | 10-1603654 | 3/2016 |
| KR | 10-1847916 | 4/2018 |

\* cited by examiner

ORGANIC LIGHT EMITTING DIODE DISPLAY AND A MANUFACTURING METHOD THEREOF

CROSS-REFERENCE TO RELATED APPLICATION

This application claims priority under 35 U.S.C. § 119 Korean Patent Application No. 10-2018-0168648 filed in the Korean intellectual Property Office on Dec. 24, 2018, the disclosure of which is incorporated by reference herein in its entirety.

TECHNICAL FIELD

The present disclosure relates to an organic light emitting diode display and a manufacturing method thereof.

DISCUSSION OF RELATED ART

An organic light emitting diode display includes two electrodes and an organic emitting layer positioned therebetween. Electrons injected from one electrode and boles injected from the other electrode are bonded to each other in the organic emitting layer to form excitons, and light is emitted when the excitons discharge energy.

The organic light emitting diode display includes a plurality of pixels including an organic light emitting diode of a self-emitting diode element. Each pixel includes a plurality of transistors and at least one capacitor for driving the organic light emitting diode.

In the organic light emitting diode display, a plurality of transistors and capacitors are generally formed on a substrate, and the organic light emitting diode including a pixel electrode, an organic emission layer, and a common electrode is stacked thereon.

SUMMARY

Exemplary embodiments of the present invention provide for a high resolution organic light emitting diode display by separately manufacturing and combining a transistor display panel and a light-emitting diode display panel electrically connected by conductive connectors.

According to an exemplary embodiment of the present invention, an organic light emitting diode display is provided including a first display panel. The first display panel includes a first substrate and a transistor disposed on the first substrate. The transistor includes an input electrode and an output electrode. A second display panel is provided including a second substrate, a first electrode disposed on the second substrate, an emission layer disposed on the first electrode, and a second electrode disposed on the emission layer. A first connector is disposed on the output electrode and between the first display panel and the second display panel. The second display panel further includes a first opening formed in the second substrate and a pixel electrode connector disposed in the first connector. The output electrode of the transistor is electrically connected to the first electrode through the first connector, and the first electrode and the first connector are electrically connected through the pixel electrode connector.

According to an exemplary embodiment of the present invention, the first substrate is a wafer.

According to an exemplary embodiment of the present invention, the first display panel includes a plurality of first display panels. A plurality of first connectors are disposed between the first display panel and the second display panel, and the plurality of first display panels are connected to the second display panel through the plurality of first connectors.

According to an exemplary embodiment of the present invention, the output electrode of the transistor formed in the first display panel is electrically connected to the first electrode of the second display panel through one of the plurality of first connectors.

According to an exemplary embodiment of the present invention, at least one sealing part is disposed between a pair of adjacent first display panels of the plurality of first display panels, and the at least one sealing part overlaps a side surface of the first display panel and a lower surface of the second display panel.

According to an exemplary embodiment of the present invention, the first display panel further includes a channel region, a source region, and a drain region disposed in the first substrate. A gate insulating layer is disposed on the first substrate. A gate electrode is disposed on the gate insulating layer, and an interlayer insulating layer is disposed on the gate electrode.

According to an exemplary embodiment of the present invention, the input electrode and the output electrode are a source electrode and a drain electrode, and the input electrode and the output electrode each is at least partially disposed on the interlayer insulating layer and respectively connected to the source region and the drain region.

According to an exemplary embodiment of the present invention, the first display panel further includes an opening that penetrates the first substrate, the gate insulating layer, and the interlayer insulating layer. A drain electrode connector is disposed in the opening, and the output electrode and the first connector are electrically connected through the drain electrode connector.

According to an exemplary embodiment of the present invention, the first display panel includes a plurality of first display panels. Two or more first connectors are disposed between at least one first display panel of the plurality of first display panels and the second display panel, and the at least one first display panel overlaps the second display panel and the two or more first connectors.

According to an exemplary embodiment of the present invention, the output electrode of the transistor is disposed in the first display panel and is electrically connected to the first electrode disposed in the second display panel through one of the plurality of first connectors.

According to an exemplary embodiment of the present invention, an upper surface of the at least one first substrate and a lower surface of the second substrate face each other with a gap disposed therebetween. The upper surface of the at least one first substrate and a lower surface of the second substrate are combined by the first connector.

According to an exemplary embodiment of the present invention, the first connector is a bump or an anisotropic conductive film (ACF).

According to an exemplary embodiment of the present invention, a method for manufacturing an organic light emitting diode display includes forming a first substrate on an assistance substrate and patterning a photoresist on the first substrate. The photoresist includes a first opening. A first electrode is formed on the first substrate overlapping the first opening. An emission layer and a second electrode are sequentially thrilled on the first electrode. The assistance substrate is separated from the first substrate to form a light-emitting diode display panel. The light-emitting diode display panel includes the first substrate, the first electrode, the emission layer, and the second electrode. A pixel electrode connector is formed in the first opening. A first connector is formed on the pixel electrode connector. A transistor display panel is disposed to face the light-emitting diode display panel with the first connector disposed therebetween. The transistor display panel includes a transistor including an output electrode. The output electrode overlaps the first connector, and the light-emitting diode display panel and the transistor display panel are connected through the first connector.

According to an exemplary embodiment of the present invention, the output electrode of the transistor is electrically connected to the first electrode through the first connector.

According to an exemplary embodiment of the present invention, the transistor display panel is manufactured by forming a second substrate with a wafer. A channel region, a source region, and a drain region in the second substrate. An insulating layer is formed on the second substrate. An input electrode is formed, the input electrode and the output electrode at least partially overlap a surface of the insulating layer.

According to an exemplary embodiment of the present invention, a second opening is formed in a first surface of the second substrate and penetrates the second substrate and the insulating layer. A drain electrode connector is formed in the second opening, and the output electrode and the first connector are electrically connected by the drain electrode connector.

According to an exemplary embodiment of the present invention, the first surface of the second substrate of the transistor display panel and a lower surface of the light-emitting diode display panel face each other.

According to an exemplary embodiment of the present invention, two or more transistor display panels are overlapped with the light-emitting diode display panel.

According to an exemplary embodiment of the present invention, two or more first connectors are formed between the first display panel and the second display panel. The output electrode of the transistor formed in the transistor display panel is electrically connected to the first electrode formed in the light-emitting diode display panel through one of the first connectors.

According to an exemplary embodiment of the present invention, the light-emitting diode display panel is irradiated to align the transistor display panel using a long wavelength laser.

According to an exemplary embodiment of the present invention, a transistor display panel includes an input electrode and an output electrode. A light-emitting diode display panel is disposed opposite to the transistor display panel with a gap disposed therebetween. A pixel electrode connector is disposed in the light-emitting diode display panel and connected to a pixel electrode. A first connector is disposed between the transistor display panel and the light-emitting diode display panel. The first connector, the pixel electrode connecter, the output electrode, and the pixel electrode overlap in a thickness direction, and the first connector and the pixel electrode connecter are electrically conductive.

DETAILED DESCRIPTION OF THE EMBODIMENTS

Figure 1:
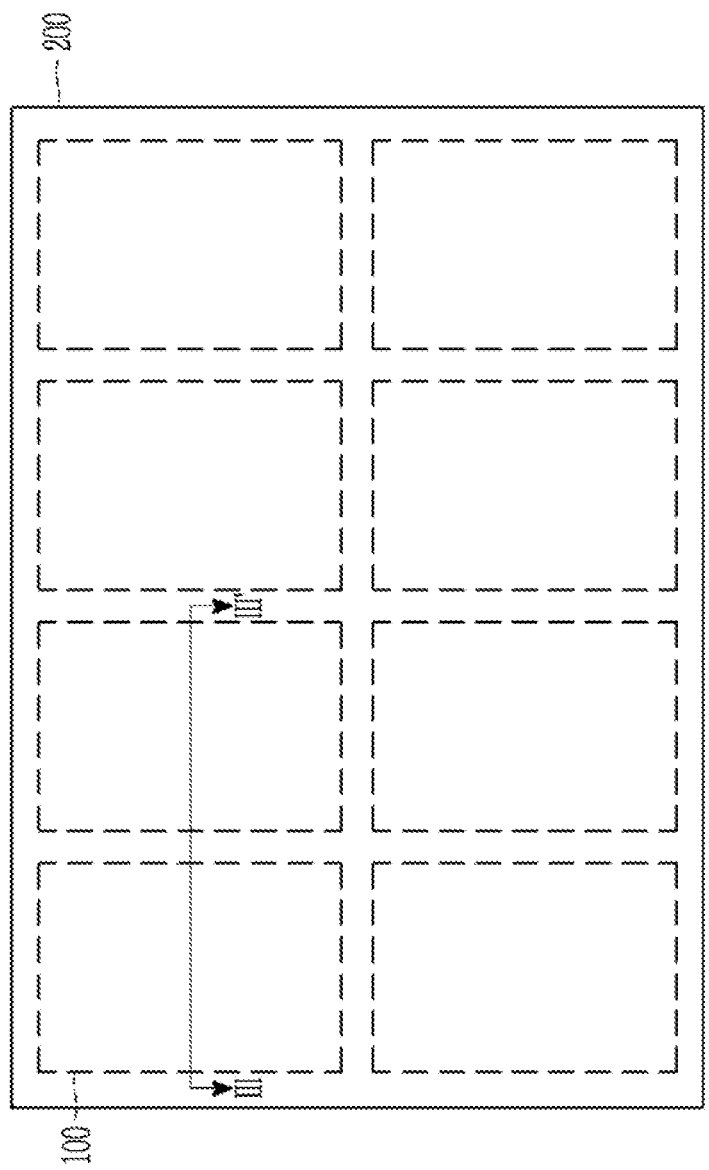
FIG. 1 is a schematic plan view illustrating an organic light emitting diode display according to an exemplary embodiment of the present invention.

The present invention will be described more fully hereinafter with reference to the accompanying drawings, in which exemplary embodiments of the invention are shown. The present invention may, however, be embodied in many different forms, and should not be construed as limited to the exemplary embodiments set forth herein.

Like reference numerals may refer to like elements throughout the following description and figures. Also, the thickness, ratio, and dimensions of elements may be exaggerated in the figures to facilitate description of technical contents.

In the drawings, a size and thickness of each element are represented for better understanding and ease of description, however, the present invention is not necessarily limited thereto. In the drawings, the thickness of layers, films, panels, regions, etc., may be exaggerated for clarity. It will also be understood that when an element such as a layer, film, region, or substrate is referred to as being "on" another element, it can be directly on the other element or intervening elements may also be present. In contrast, when an element is referred to as being "directly on" another element, there are no intervening elements present.

Further, in the specification, the word "on" or "above" means positioned on or below the object portion, and does not necessarily mean positioned on the upper side of the object portion based on a gravitational direction.

The organic light emitting diode display according to an exemplary embodiment of the present invention is formed by manufacturing a first display panel 100 and a second display panel 200, and combining the first display panel 100 and the second display panel 200 by a first connector 70.

The organic light emitting diode display according to an exemplary embodiment of the present invention is described with reference to FIG. 1 to FIG. 14.

Figure 2:
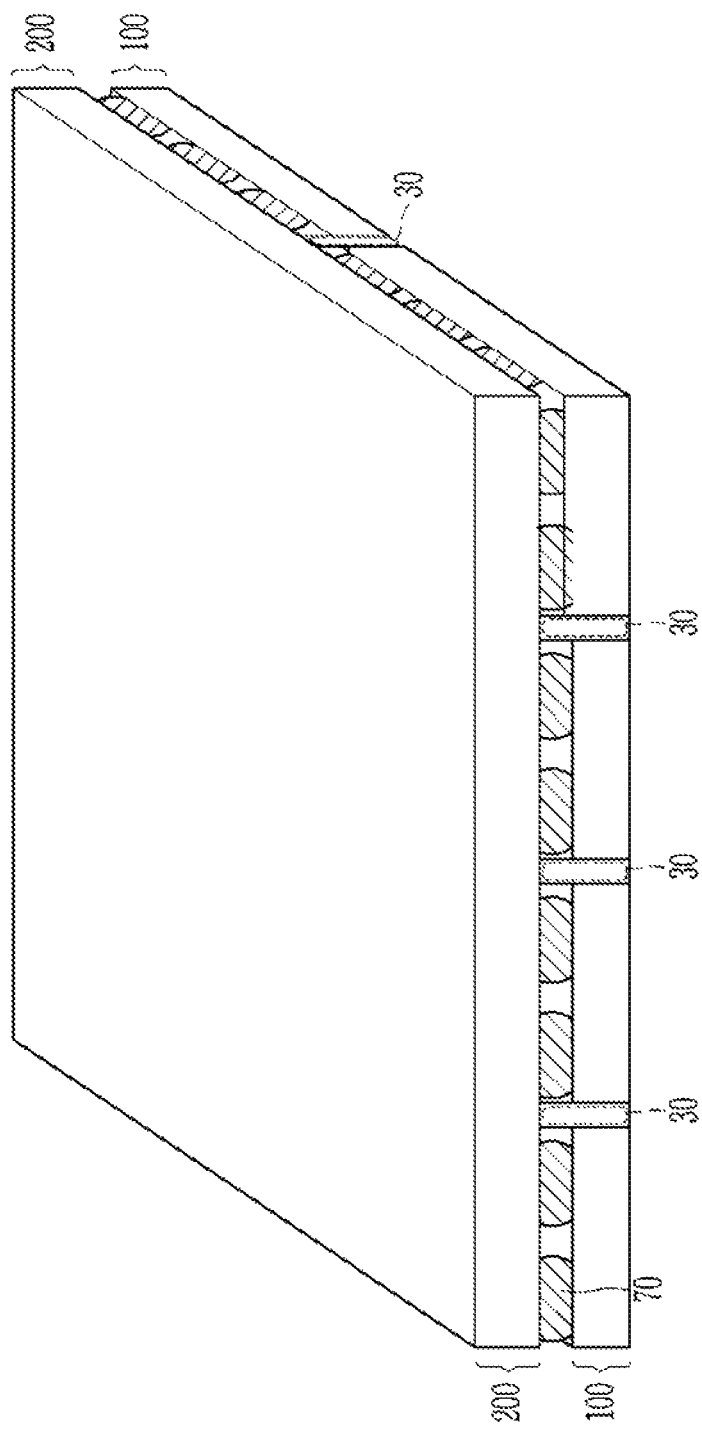
FIG. 2 is a schematic perspective view illustrating an organic light emitting diode display according to an exemplary embodiment of the present invention.
Figure 3:
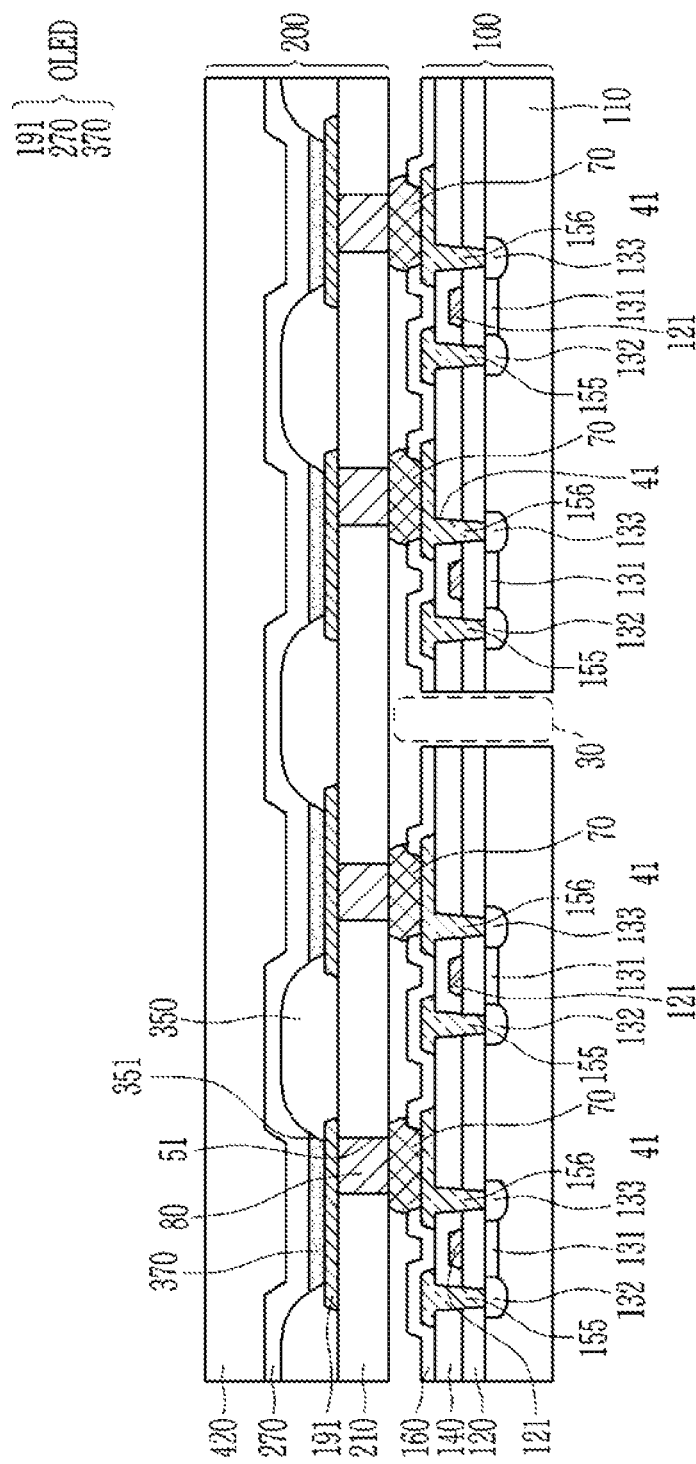
FIG. 3 is a cross-sectional view taken along line III-III' of FIG. 1 according to an exemplary embodiment of the present invention.

FIG. 1 is a schematic plan view illustrating an organic light emitting diode display according to an exemplary embodiment of the present invention. FIG. 2 is a schematic perspective view illustrating an organic light emitting diode display according to an exemplary embodiment of the present invention. FIG. 3 is a cross-sectional view taken along line of FIG. 1. FIG. 4 to FIG. 14 are cross-sectional views illustrating a method of manufacturing an organic light emitting diode display according to an exemplary embodiment of the present invention.

Referring to FIG. 1 and FIG. 2, the organic light emitting diode display according to an exemplary embodiment of the present invention includes the first display panel 100 and the second display panel 200. The first display panel 100 may be formed in plural, and the second display panel 200 may be singular.

The first display panel 100 overlaps the second display panel 200. For example, as depicted in FIGS. 1 and 2, the plurality of first display panels 100 are arranged in a matrix and overlap the second display panel 200. According to FIG. 1 and FIG. 2, eight first display panels 100 are arranged in the form of a 2×4 matrix under the second display panel 200. Depending on the relative sizes of each display panel, the number of the first display panels 100 overlapping on the one second display panel 200 may be variously changed.

In addition, although the first display panel 100 and the second display panel 200 according to an exemplary embodiment are shown as rectangles, the shape of the first display panel 100 may be variously changed according to the shape of the second display panel 200. For example, a singular first display panel 100 or a collective shape of a plurality of first display panels 100 may have a shape that corresponds to a shape of the second display panel 200, when viewed in a plan view.

As illustrated in FIGS. 1 and 2, the plurality of first display panels 100 are connected to the second display panel 200 by the first connectors 70. For example, two first connectors 70 are disposed on a short side of an upper surface of at least one first display panel 100, and three first connectors 70 are disposed on a long side of the upper surface of the first display panel 100. The first connectors 70 are disposed on a lower surface of the second display panel 200. For example, the first connectors 70 are connected to a lower surface of the second display panel 200.

The first connector 70 electrically connects to a pixel electrode 191 (shown below in FIG. 3) formed in the second display panel 200, and a drain electrode 156 (shown in FIG. 3 below) of the transistor formed in the first display panel 100. One pixel is electrically connected to one pixel electrode 191. According to an exemplary embodiment of the present invention, the plurality of pixel electrodes 191 and the plurality of drain electrodes 156 are connected in a one-to-one structure by using one first connector 70 for each pair. The first connector 70 may be formed as a bump, an anisotropic conductive film, or the like. For example, when the first connector 70 includes an anisotropic conductive film formed between the first display panel 100 and the second display panel 200, the drain electrode 156 may be electrically connected to the pixel electrode 191 by a plurality of small conductive balls included in the anisotropic conductive film (ACF).

A sealing agent is disposed between adjacent first display panels 100 of the plurality of first display panels 100 and form a sealing part 30. The sealing part 30 contacts a side surface of the adjacent first display panels 100 and the lower surface of the second display panel 200. The sealing part 30 may protect the first display panel 100 from moisture and air and may adhere the first display panel 100 to the second display panel 200.

According to an exemplary embodiment of the present invention, the second display panel 200 and the first display panel 100 which are separately manufactured are connected by the first connector 70. The first display panel 100 and the second display panel 200 may be manufactured by different process conditions, and the transistor may be formed in a wafer substrate and combined to the organic light emitting diode (OLED) element to drive the organic light emitting diode (OLED). For example, as the transistors are formed on the wafer substrate of a small size, more pixels including the transistors are formed in the same area, thereby providing a high-resolution display device.

In addition, since the number of the first display panels 100 attached to the second display panel 200 may be varied, a large area and high resolution organic light emitting diode display may be provided according to the size of the second display panel 200.

Next, the detailed structure of the organic light emitting diode display is described with reference to FIG. 3.

The first display panel 100 formed in the wafer substrate to provide the high resolution organic light emitting diode display is described.

The first display panel 100 includes the transistor disposed on a first substrate 110. The first display panel 100 includes a first substrate 110, a channel region 131, a source region 132, a drain region 133, a gate insulating layer 120, a source electrode 155, the drain electrode 156, a gate electrode 121, an interlayer insulating layer 140, and a passivation layer 160. Here, the first display panel 100 may also be referred to as a transistor display panel.

The first substrate 110 is formed using a wafer substrate. For example, the first substrate 110 may include monocrystalline silicon, and the wafer substrate may be formed by thinly slicing the monocrystalline silicon into a predetermined thickness and width.

The first substrate 110 may be a p-type including holes or an n-type including electrons depending on a type of silicon employed.

The channel region 131, the source region 132, and the drain region 133 are formed in the first substrate 110. The channel region 131 is a region where the impurity is not doped in the first substrate 110, and the source region 132 and the drain region 133 are impurity-doped regions.

When the first substrate 110 is the p-type silicon substrate, the source region 132 and the drain region 133 are doped with electrons to form the channel region 131 as an n-channel. When the first substrate 110 is the n-type silicon substrate, the source region 132 and the drain region 133 are doped with holes to form the channel region 131 as a p-channel. According to an exemplary embodiment of the present invention, a lightly doped drain region (LDD) may be formed between the source region 132 and the channel region 131, and between the drain region 133 and channel region 131.

The gate insulating layer 120 covers the first substrate 110, the channel region 131, the source region 132, and the drain region 133, and may be made of a silicon oxide (SiOx).

The gate electrode 121 is disposed on the gate insulating layer 120, and may be made of a multi-layer or monolayer film of copper (Cu), molybdenum (Mo), aluminum (Al), or titanium (Ti). The gate electrode 121 is disposed to overlap the channel region 131.

The interlayer insulating layer 140 covers the gate electrode 121 and the gate insulating layer 120, and may be made of $SiO_x$.

The source electrode 155 and the drain electrode 156 are partially disposed on the interlayer insulating layer 140 and penetrate through the insulating layer 140 and the gate insulating layer 120 in a thickness direction. The source electrode 155 and the drain electrode 156 are connected to the source region 132 and the drain region 133 through an opening formed in the gate insulating layer 120 and the interlayer insulating layer 140, respectively.

The gate electrode 121, the source electrode 155, and the drain electrode 156 form one metal-oxide-semiconductor field-effect transistor (MOSFET) together with the channel region 131, the source region 132, and the drain region 133. The source electrode 155 may be the input electrode of the transistor, and the drain electrode 156 may be the output electrode of the transistor. In addition, the source electrode 155 and the drain electrode 156 may be changed into an output electrode and an input electrode, respectively, depending, on an applied current direction. The transistor may be one of a switching transistor, a driving transistor, and a compensation transistor disposed in the pixel of the organic light emitting diode display. The first substrate 110, on which such a transistor is formed, may be referred to as a transistor display panel (hereinafter also referred to as the first display panel).

The transistor is disposed in the pixel (a display area), and a peripheral circuit wiring unit may be formed by simple patterning in the display area other than the region where the transistor is formed on the first substrate 110. According to an exemplary embodiment of the present invention, the peripheral circuit wiring unit may be formed on the first substrate 110, thereby reducing the non-display area.

The passivation layer 160 is disposed on the interlayer insulating layer 140, and covers the interlayer insulating layer 140, the source electrode 155, and the drain electrode 156. The passivation layer 160 may be made of an inorganic insulating layer such as a $SiN_x$ and/or $SiO_x$.

The passivation layer 160 has an opening 41 exposing a portion of the drain electrode 156. The opening 41 formed in the passivation layer 160 is formed to connect the drain electrode 156 and the pixel electrode 191.

The organic light emitting diode display according to an exemplary embodiment of the present invention is electrically connected to the drain electrode 156 and the pixel electrode 191 through a connector. For example, the organic light emitting diode display may be electrically connected to the drain electrode 156 through the connector without being in direct contact. The connector include the first connector 70 and/or a pixel electrode connector 80. The first connector 70 and the pixel electrode connector 80 will be described in detail after first describing the second display panel 200.

The second display panel 200 includes the pixel electrode 191, an organic emission layer 370, a partition 350, a common electrode 270, and a thin film encapsulation layer 420 disposed on a second substrate 210. The second display panel 200 may be referred to as a light-emitting diode display panel (hereinafter also referred to as a second display panel).

The second substrate 210 may be made of a polyimide (PI) film and/or a plastic. However, the present invention is not limited thereto, and the second substrate 210 may be formed of an insulating substrate such as glass, quartz, and/or ceramic. Also, the second substrate 210 may include a first opening 51 within which a connector may be disposed.

The pixel electrode 191 is disposed on the second substrate 210, and is formed of a transparent conductive material such as indium-tin oxide (ITO), indium-zinc oxide (IZO), zinc oxide (ZnO), indium oxide ($In_2O_3$), and/or a reflective metal such as lithium (Li), lithium fluoride/aluminum (LiF/Al), Al, silver (Ag), magnesium (Mg), gold (Au), and the like.

The pixel electrode 191 may be electrically connected to the drain electrode 156 through the first opening 51 formed in the second substrate 210 and may be the anode electrode of the organic light emitting diode (OLED). The pixel electrode 131 may be referred to as a first electrode (hereinafter also referred to as a pixel electrode) of an organic light emitting diode (OLED).

The partition 350 may be disposed on the upper surface of the second substrate 210 and overlap an edge of the pixel electrode 191. Partition 350 has an opening 351 exposing: the pixel electrode 191. The partition 350 may be made of a resin such as a polyacryl-based (polyacrylic), a PI resin and/or a silica-based inorganic material.

The organic emission layer 370 is disposed at the opening 351 of the partition 350. The organic emission layer 370 includes an emission layer, a hole-injection layer (HIL), a hole-transporting layer (HTL), an electron-transporting layer (ETL), and/or an electron-injection layer (EIL).

The common electrode 270 is disposed on the partition 350 and the organic emission layer 370. The common electrode 270 may include a transparent conductive material such as ITO, IZO, ZnO, $In_2O_3$, and the like. According to an exemplary embodiment of the present invention, the common electrode 270 may include a reflective metal such as calcium (Ca), lithium fluoride/calcium (LiF/Ca), Ag, Mg, Au, and the like. The common electrode 270 may be a cathode of the organic light emitting diode (OLED). The pixel electrode 191, the organic emission layer 370, and the common electrode 270 may collectively comprise the organic light emitting diode (OLED). The common electrode 270 may be referred to as the second electrode (hereinafter also referred to as a common electrode) of the organic light emitting diode (OLED).

The thin film encapsulation layer 420 is disposed on an organic light emitting element (OLED), and covers the organic light emitting element (OLED). The thin film encapsulation layer 420 may include a plurality of layers, and an uppermost one of the plurality of layers may be formed as an inorganic layer including an inorganic material. For example, the thin film encapsulation layer 420 may be formed by alternatingly laminating at least one organic layer and at least one inorganic layer. Here, the organic layer or inorganic layer may each be provided in plural. The organic layer is formed of an organic material, and more preferably, may be a single layer or laminated layers that can include polyethylene terephthalate (PET), PI, polycarbonate (PC), epoxy, polyethylene (PE), and polyacrylate (PA). More preferably, the organic layer is formed of PA, and, for example, includes a material in which a monomer, composition including a diacrylate-based monomer and/or a triacrylate-based monomer is polymerized. The monomer composition may further include a monoacrylate-based monomer. Further, the monomer composition may include a known photoinitiator such as TPO, but it is not limited thereto. The inorganic layer may be a single layer or laminated layers including a metal oxide an/or a metal nitride. For example, the inorganic layer may include $SiN_x$, aluminum oxide ($Al_2O_3$), a silicon dioxide ($SiO_2$), and/or titanium oxide ($TiO_2$).

The thin film encapsulation layer 420 may protect the organic light emitting diode (OLED) from external moisture. The thin film encapsulation layer 420 may be laterally extended such that the partition 350 and the common electrode 270 are sealed.

An optical layer for increasing light extraction efficiency and preventing reflection of external light may be further included between the thin film encapsulation layer 420 and the common electrode 270.

The first connector 70 may be formed between the first display panel 100 and the second display panel 200, thereby combining the first display panel 100 and the second display panel 200. The first connector 70 may electrically connect the drain electrode 156 of the first display panel 100 and the pixel electrode 191 disposed in the second display panel 200. The first connector 70 may include a conductive material. The first connector 70 may be implemented, for example, as a bump, an anisotropic conductive film, or the like.

The pixel electrode connector 80 is formed in the first opening 51 of the second substrate 210. The pixel electrode connector 80 is in contact with the first connector 70 so that the pixel electrode 191 and the drain electrode 156 are electrically connected. The pixel electrode connector 80 is made of a material having conductivity, and may be formed by electroplating.

A method of manufacturing the organic light emitting diode display shown in FIG. 1 to FIG. 3 is described with reference to FIG. 4 to FIG. 14.

FIG. 4 to FIG. 14 are cross-sectional views illustrating a method of manufacturing an organic light emitting diode display according to an exemplary embodiment of the present invention.

The organic light emitting diode display manufacturing method may include steps for separately manufacturing the first display panel 100 and the second display panel 200 and combining the first display panel 100 and the second display panel 200 by the first connector 70.

FIG. 4 to FIG. 12 are cross-sectional views of the method for manufacturing the second display panel 200.

Figure 4:
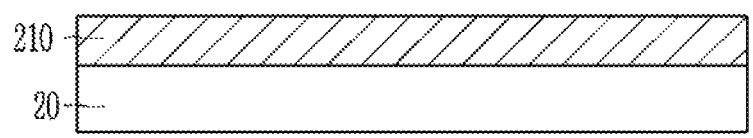
FIG. 4 to FIG. 14 are cross-sectional views illustrating a method of manufacturing an organic light emitting diode display according to an exemplary embodiment of the present invention.

FIG. 4 shows a step of preparing the second substrate 210 of the second display panel 200. Referring to FIG. 4, the second substrate 210 may include a PI film formed on an assistance substrate 20 which may include glass.

Figure 5:
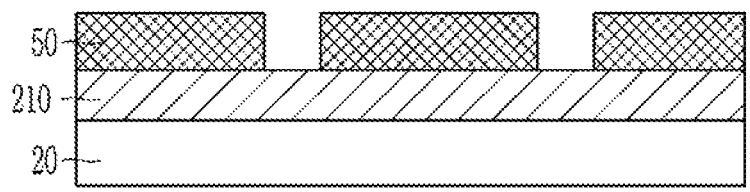
Figure 6:
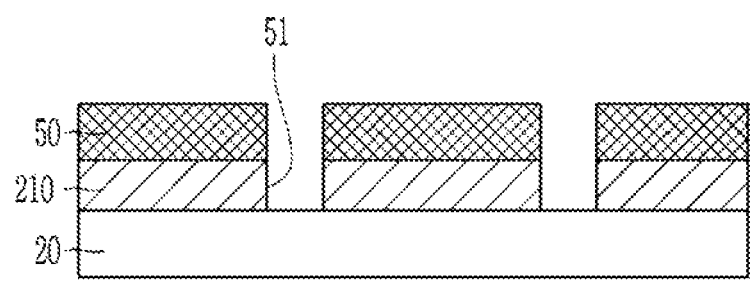

FIG. 5 and FIG. 6 show a step of forming an opening in the second substrate 210.

In FIG. 5, a photoresist 50 is coated on the second substrate 210. The photoresist 50 may be coated corresponding to a part that is not to be etched in the second substrate 210. For example, the photoresist 50 may be disposed on the second substrate 210 to include predetermined gaps which correspond to an area within which the first openings are to be formed. According to an exemplary embodiment of the present invention, the first openings 51 may be formed prior to overlaying the photoresist 50 on the second substrate 210.

In FIG. 6, the first opening 51 is formed corresponding to a portion of the second substrate 210 that is not coated with the photoresist 50. For example, the part of the second substrate 210 where the photoresist 50 is not coated is removed.

FIG. 7 to FIG. 10 show each additional step to complete the light-emitting diode display panel, according to an exemplary embodiment of the present invention.

Figure 7:
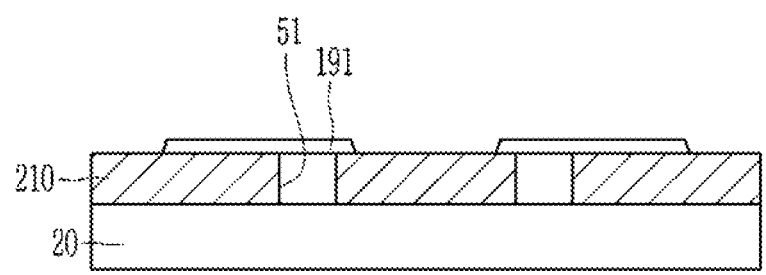

In FIG. 7, the photoresist 50 is removed from the second substrate 210, and the pixel electrode 191 is disposed across the first opening 51 of the second substrate 210. For example, the pixel electrode 191 may be disposed to overlap the first opening 51 in a thickness direction. Part of the pixel electrode 191 may be exposed by the first opening 51. For example, a lower surface of the pixel electrode 191 may be exposed by the first opening 51. The edge of the pixel electrode 191 may be disposed at the edge of the first opening 51.

Figure 8:
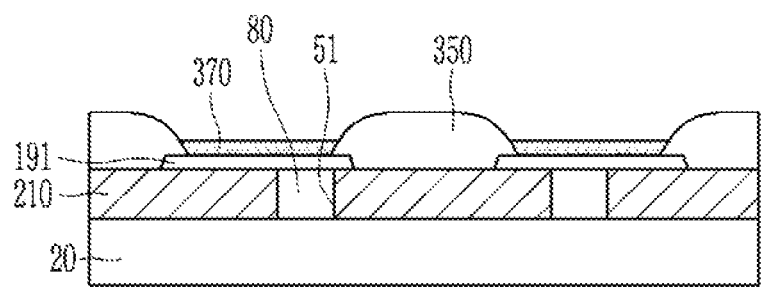

In FIG. 8, the partition 350 may be formed on the edge of the pixel electrode 191, and the organic emission layer 370 is formed in the opening 351 of the partition 350. The common electrode 270 (see FIG. 9) is formed on the organic emission layer 370 and the partition 350. Also, the thin film encapsulation layer 420 may protect the organic emission layer 370 and the common electrode 270 (see FIG. 9) from external moisture.

Figure 9:
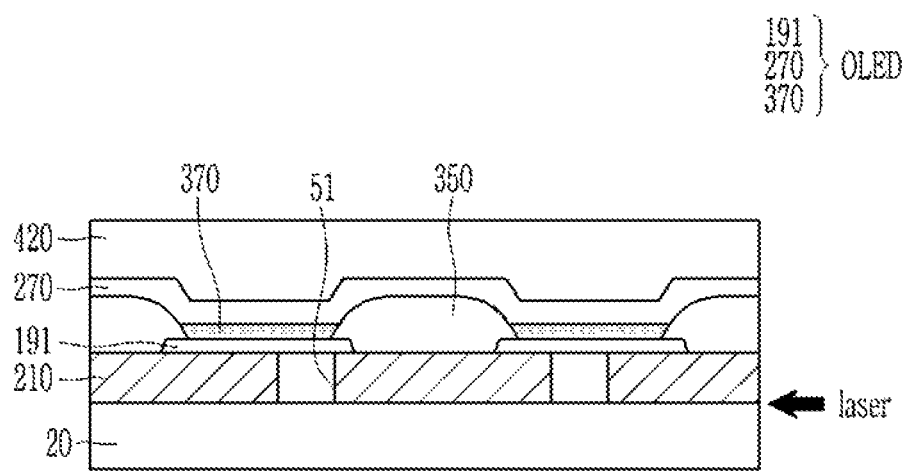

FIG. 9 shows a step of separating the assistance substrate 20 from the second substrate 210. The assistance substrate 20 may be separated by laser irradiation directed at a boundary between the assistance substrate 20 and the second substrate 210, and electric laser plating (ELP), solid laser plating (SLP), or non-laser plating (NLP) may be applied depending on a laser irradiation method employed. Since adhesion between the second substrate 210 and the assistance substrate 20 is non-uniform due to the first opening 51 of the second substrate 210, the assistance substrate 20 might not properly separate. When preparing the second substrate 210 and the assistance substrate 20 according to FIG. 4, charge layers may be formed between the second substrate 210 and the assistance substrate 20 having different charges, thus the assistance substrate 20 may be easily separated by static electric attraction. According to an exemplary embodiment of the present invention, to facilitate the complete separation of the assistance substrate 20, steps of forming the first opening 51 in the second substrate 210 shown in FIG. 5 and FIG. 6 and separating the assistance substrate 20 of FIG. 9 from the second substrate 210 may be performed later. For example, the first opening 51 may be formed after removal of the assistance substrate 20 from the second substrate 210 as depicted in FIG. 9.

Figure 10:
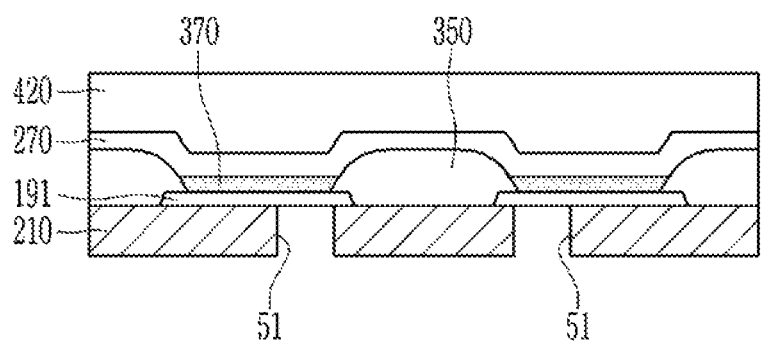

FIG. 10 shows the second display panel 200 including the first opening 51 disposed in the organic light emitting diode display according to an exemplary embodiment of the present invention.

Figure 11:
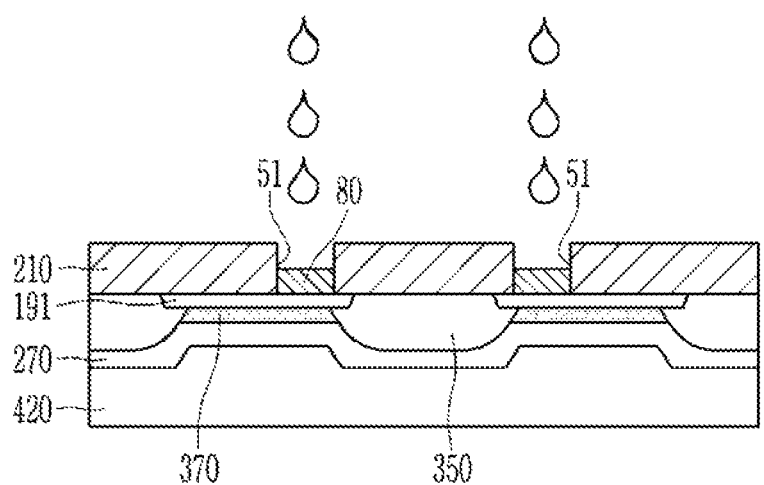
Figure 12:
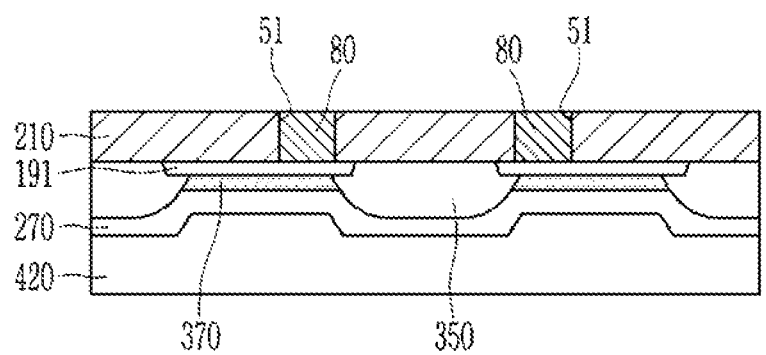

FIG. 11 and FIG. 12 illustrate steps for forming the first connector 70 that may combine the first display panel 100 to the second display panel 200.

In FIG. 11, when forming the pixel electrode connector 80, the pixel electrode connector 80 may be formed by using a metal paste inkjet method.

FIG. 12 illustrates an exemplary embodiment of the present invention in which the pixel electrode connector 80 is formed by the metal paste inkjet method as depicted in FIG. 11. The first opening 51 of the second substrate 210 may be filled with a metal material such as Ag, Au, and/or Al to form the pixel electrode connector 80.

Figure 13:
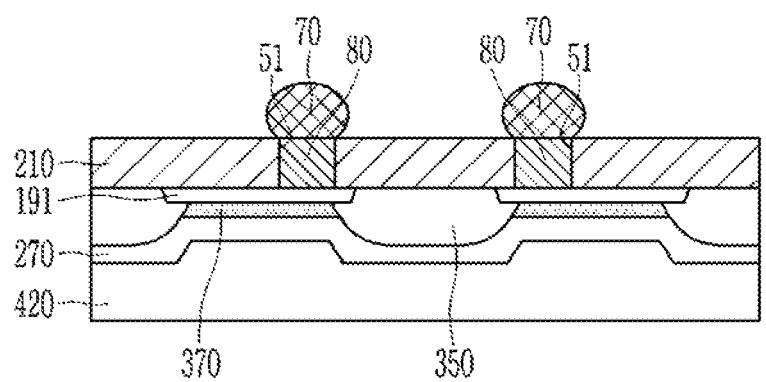

FIG. 13 illustrates a step for forming the first connector 70. Referring to FIG. 13, the first connector 70 may be formed on the pixel electrode connector 80. The first connector 70 may be formed of the conductive material and may electrically connect the pixel electrode 191 and the drain electrode 156 along with the pixel electrode connector 80. For example, the first connector 70 may be implemented as a bump, an anisotropic conductive film (ACF), or the like.

Figure 14:
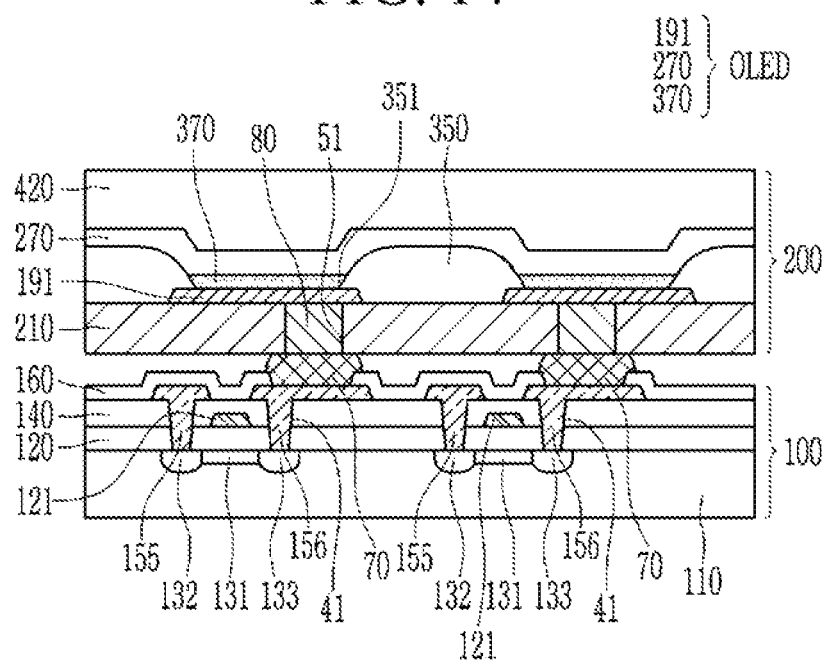
Figure 15:
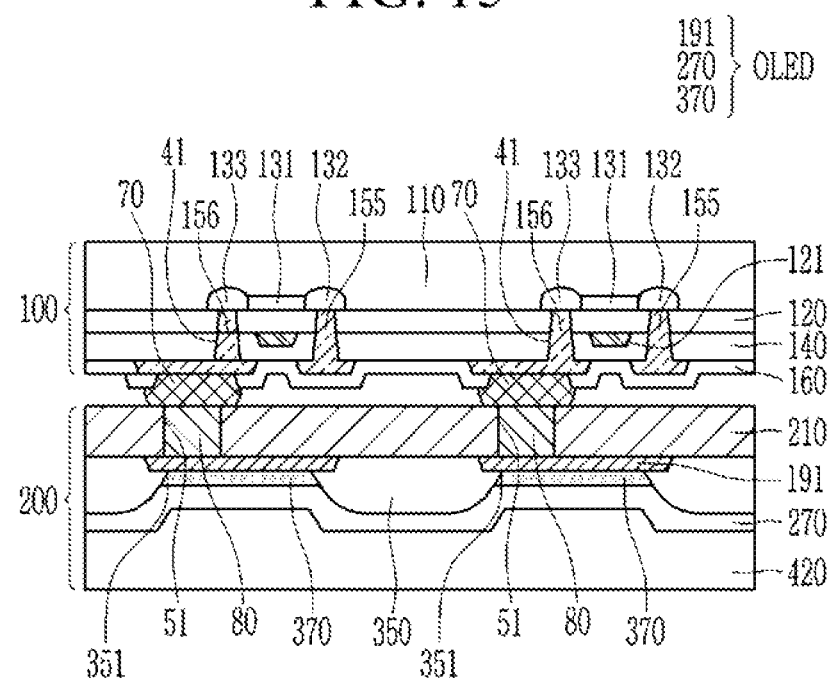
FIG. 15 is a cross-sectional view illustrating an organic light emitting diode display according to an exemplary embodiment of the present invention.

According to the exemplary embodiments of the present invention illustrated in FIG. 14 and FIG. 15, the first display panel 100 including the prepared transistor may be disposed on the first connector 70 to face the second display panel 200, and the first display panel 100 and the second display panel 200 may be combined. The first display panel 100 and the second display panel 200 may be connected by the first connector 70 with a gap formed therebetween. For example, a shock absorbent insulating material may be disposed between the first display panel 100 and the second display panel 200 in regions not occupied by the first connector 70.

According to an exemplary embodiment of the present invention, the first connector 70 may be disposed in an openings of the passivation layer 160 in which the drain electrode 156 is exposed, and the passivation layer 160 may be disposed directly on the second substrate 210. For example, the first connector 70, the passivation layer 160 and the second substrate 210 may be substantially coplanar.

In FIG. 14, the second display panel 200 is disposed on the first connector 70 and the first display panel 100 is disposed under the first connector 70 as an upper panel and a lower panel, respectively. In FIG. 15, the first display panel 100 may be disposed on the first connector 70 and the second display panel 200 may be disposed under the first connector 70 as an upper panel and a lower panel, respectively. The organic light emitting diode displays may be implemented in the same manner described heretofore regardless of the designation of the upper panel and the lower panel about the first connector 70.

Referring again to FIG. 14 and FIG. 15, the lower surface of the second substrate 210 may be disposed to face the part where the drain electrode 156 of the first display panel 100 is exposed, and the pixel electrode 191 may be electrically connected to the drain electrode 156 through the pixel electrode connector 80 and the first connector 70. For example, the pixel electrode 191 may be electrically connected to the drain electrode 156 in a thickness direction.

When the second display panel 200 is disposed upward and the first display panel 100 is disposed downward as illustrated according to the exemplary embodiment of the present invention of FIG. 14 an alignment problem may occur in which the combination position of the first display panel 100 is determined by the opaque second substrate 210. In this case, a long wavelength laser may be used to pass through the second substrate 210 and align the first display panel 100 at the correct position. When the long wavelength laser irradiates the top of the second display panel 200, the side surface of the first display panel 100 may be recognized through the second substrate 210, so that a plurality of first display panels 100 may be disposed at the correct positions.

According to FIG. 14 and FIG. 15, a plurality of first display panels 100 may be combined to one second display panel 200, as shown in FIG. 1 and FIG. 2.

Here, the second display panel 200 may be manufactured by the manufacturing method of FIG. 4 to FIG. 12, and the first display panel 100 may be manufactured by a transistor forming process.

Figure 19:
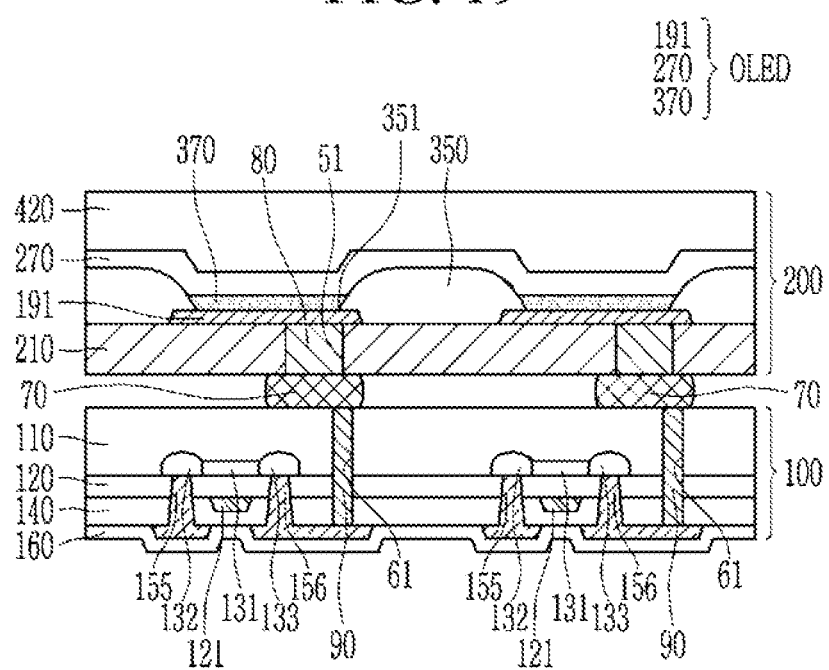
Figure 20:
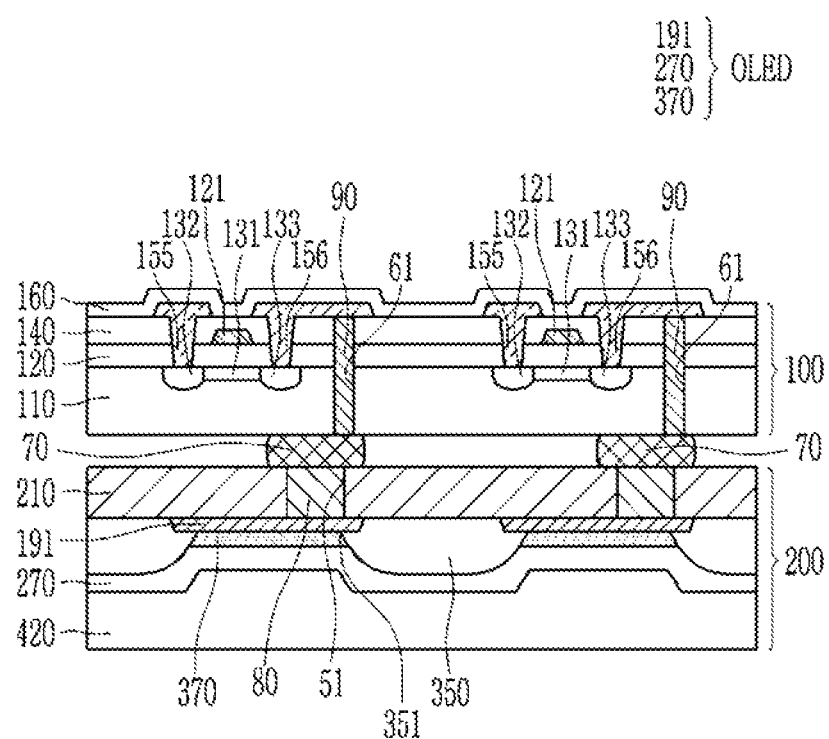
FIG. 20 is a cross-sectional view illustrating an organic light emitting diode display according to an exemplary embodiment of the present invention.

According to an exemplary embodiment of the present invention as depicted in FIGS. 19 and 20, the first display panel 100 and the second display panel 200 may be combined so that the first substrate 110 and the lower surface of the second substrate 210 face each other. In this case, an opening may be formed in the first substrate 110 to electrically connect the pixel electrode 191 and the drain electrode 156.

A method of manufacturing the first display panel 100 including the opening and the organic light emitting diode display are described with reference to FIG. 16 to FIG. 20.

Figure 16:
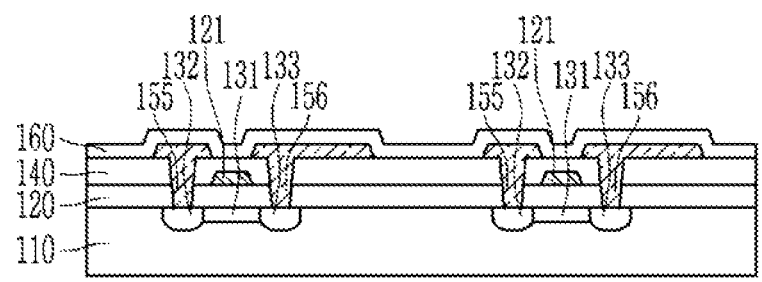
FIG. 16 to FIG. 19 are cross-sectional views illustrating a method of manufacturing an organic light emitting diode display according to an exemplary embodiment of the present invention.
Figure 17:
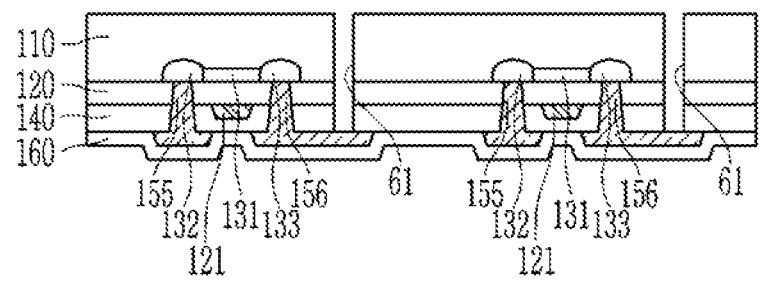
Figure 18:
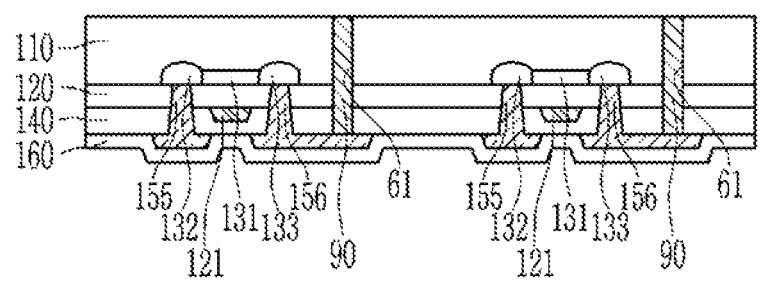

First, FIG. 16 to FIG. 18 are cross-sectional views of a method of manufacturing the first display panel 100.

Referring to FIG. 16, the first substrate 110 may include a wafer doped with electrons or holes to form the source region 132 and the drain region 133. The channel region 131 is formed between the source region 132 and the drain region 133, for example, in the first substrate 110.

The gate insulating, layer 120 is formed on the channel region 131, the source region 132, and the drain region 133, and the gate electrode 121 is formed on the gate insulating layer 120. For example, the gate electrode 121 may be disposed between the source electrode 155 and the drain electrode 156 and may overlap the channel region 131 in a thickness direction. The interlayer insulating layer 140 is formed on the gate electrode 121 and the gate insulating layer 120. Openings are formed in the gate insulating layer 120 and the interlayer insulating layer 140 to be respectively connected to the source region 132 and the drain region 133. The source electrode 155 and the drain electrode 156 may be formed with at least a portion overlapping, an upper surface of the interlayer insulating layer 140 and another portion penetrating through the interlayer insulating layer 140 and the gate insulating layer 120. The passivation layer 160 is formed to cover an upper surface of the interlayer insulating layer 140, the source electrode 155 and the drain electrode 156. Here, the gate insulating layer 120 and the interlayer insulating layer 140 may be collectively referred to as an insulating layer.

Referring to FIG. 17, a second opening 61 penetrating the first substrate 110, the gate insulating layer 120, and the interlayer insulating layer 140 is formed. The second opening 61 is formed to expose part of the drain electrode 156.

Referring to FIG. 18, the metal material of Ag, Au, and/or Al is filled in the second opening 61 of the first substrate 110 to form a drain electrode connector 90.

FIG. 19 and FIG. 20 are cross-sectional views of an organic light emitting diode display, according to an exemplary embodiment of the present invention.

Referring to FIG. 19, the first connector 70 is formed on the drain electrode connector 90 of the prepared first display panel 100. The second display panel 200 is disposed to face the first display panel 100, and the first display panel 100 and the second display panel 200 are combined through the first connector 70.

The second display panel 200 may be disposed on the first connector 70 and the first display panel 100 may be disposed under the first connector 70 to be combined as the upper panel and the lower panel, respectively.

Referring to FIG. 20, the first display panel 100 may be disposed on the first connector 70 and the second display panel 200 may be disposed under the first connector 70 to be combined as the upper panel and the lower panel, respectively. The organic light emitting diode displays are implemented in the same manner regardless of the designation of the upper panel and the lower panel about the connector 70.

Referring to FIG. 19 and FIG. 20 in the organic light emitting diode display according to an exemplary embodiment of the present invention, the lower surface of the second substrate 210 is disposed so that the first substrate 110 of the first display panel 100 faces the lower surface. Accordingly, the drain electrode 156 of the first display panel 100 may be electrically connected to the pixel electrode 191 through the drain electrode connector 90, the pixel electrode connector 80, and the first connector 70.

When the second display panel 200 is the upper panel upward and the first display panel 100 is the lower panel, an alignment problem for determining the combination position of the first display panel 100 may occur due to the opaque second substrate 210. In this case, the long wavelength laser is used to pass through the second substrate 210 to align the first display panel 100 at the correct position. When the long wavelength laser irradiates the top of the second display panel 200, the side surface of the first display panel 100 may be recognized through the second substrate 210, so that the plurality of first display panels 100 may be disposed at the correct positions.

For the second display panel 200 and the first display panel 100 according to FIG. 19 and FIG. 20, a plurality of first display panels 100 may be combined to one second display panel 200 according to FIG. 1 and FIG. 2.

According to an exemplary embodiment of the present invention, since the second display panel 200 and the first display panel 100 that are separately manufactured may be connected by the first connector 70 and the first display panel 100 and the second display panel 200 may be manufactured by the different conditions, the transistor may be formed in the wafer substrate and combined to the organic light emitting diode (OLED) to drive the organic light emitting diode (OLED). That is, because the transistors are formed on a small wafer substrate, more pixels including the transistors may be formed in the same area, thereby providing the high-resolution display device.

In addition, since the number of the first display panels 100 attached to the second display panel 200 may be varied, a large area high resolution organic light emitting diode display may be provided according to the size of the second display panel 200.

While exemplary embodiments of the present invention have been shown and described above, it is to be understood by one of ordinary skill in the art that variations in form and detail may be made therein without departing from the spirit and scope of the present disclosure, as defined by the appended claims.

What is claimed is:

1. An organic light emitting diode display comprising:
   a first display panel including a first substrate and a transistor disposed on the first substrate, the transistor including an input electrode and an output electrode;
   a second display panel including a second substrate, a first electrode disposed on the second substrate, an emission layer disposed on the first electrode, and a second electrode disposed on the emission layer;
   a first connector disposed on the output electrode and between the first display panel and the second display panel; and
   at least one sealing part overlapping a side surface of the first display panel and a lower surface of the second display panel,
   wherein the second display panel further includes a first opening formed in the second substrate and a pixel electrode connector disposed in the first opening,
   wherein the output electrode of the transistor is electrically connected to the first electrode through the first connector, and
   wherein the first electrode and the first connector are electrically connected through the pixel electrode connector.

2. The organic light emitting diode display of claim 1, wherein the first substrate is a wafer.

3. The organic light emitting diode display of claim 1, wherein the first display panel includes a plurality of first display panels,
   wherein a plurality of first connectors are disposed between the first display panel and the second display panel, and
   wherein the plurality of first display panels are connected to the second display par el through the plurality of first connectors.

4. The organic light emitting diode display of claim 3, wherein the output electrode of the transistor formed in the first display panel is electrically connected to the first electrode of the second display panel through one of the plurality of first connectors.

5. The organic light emitting diode display of claim 4, wherein the at least one sealing part is disposed between a pair of adjacent first display panels of the plurality of first display panels.

6. An organic light emitting diode display comprising:
   a first display panel including a first substrate and a transistor disposed on the first substrate, the transistor including an input electrode and an output electrode;
   a second display panel including a second substrate, a first electrode disposed on the second substrate, an emission layer disposed on the first electrode, and a second electrode disposed on the emission layer; and
   a first connector disposed on the output electrode and between the first display panel and the second display panel,
   wherein the second display panel further includes a first opening formed in the second substrate and a pixel electrode connector disposed in the first opening,
   wherein the output electrode of the transistor is electrically connected to the first electrode through the first connector, and
   wherein the first electrode and the first connector are electrically connected through the pixel electrode connector, wherein the first display panel further includes:
   a channel region, a source region, and a drain region disposed in the first substrate;
   a gate insulating layer disposed on the first substrate;
   a gate electrode disposed on the gate insulating layer; and
   an interlayer insulating layer disposed on the gate electrode.

7. The organic light emitting diode display of claim 6, wherein the input electrode and the output electrode are a source electrode and a drain electrode, and
   wherein the input electrode and the output electrode each is at least partially disposed on the interlayer insulating layer and respectively connected to the source region and the drain region.

8. The organic light emitting diode display of claim 6, wherein the first display panel further includes:
   an opening that penetrates the first substrate, the gate insulating layer, and the interlayer insulating layer; and
   a drain electrode connector disposed in the opening, and
   the output electrode and the first connector are electrically connected through the drain electrode connector.

9. The organic light emitting diode display of claim 8, wherein the first display panel includes a plurality of first display panels,
   wherein two or more first connectors are disposed between at least one first display panel of the plurality of first display panels and the second display panel, and
   wherein the at least one first display panel overlaps the second display panel and the two or more first connectors.

10. The organic light emitting diode display of claim 9, wherein a plurality of first connectors are disposed between the first display panel and the second display panel, and
    wherein the output electrode of the transistor disposed in the first display panel is electrically connected to the first electrode disposed in the second display panel through one of the plurality of first connectors.

11. The organic light emitting diode display of claim 9, wherein an upper surface of the at least one first substrate and a lower surface of the second substrate face each other with a gap disposed therebetween, and
    wherein the upper surface of the at least one first substrate and a lower surface of the second substrate are combined by the first connector.

12. The organic light emitting diode display of claim 1, wherein the first connector is a bump or an anisotropic conductive film (ACF).

* * * * *